US008987746B2

(12) United States Patent
Chung et al.

(10) Patent No.: US 8,987,746 B2
(45) Date of Patent: Mar. 24, 2015

(54) ARRAY SUBSTRATE FOR LIQUID CRYSTAL DISPLAY DEVICE

(71) Applicant: LG Display Co., Ltd., Seoul (KR)

(72) Inventors: Eui-Hyun Chung, Goyang-si (KR); Jung-Il Lee, Goyang-si (KR); Ka-Kyung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/104,156

(22) Filed: Dec. 12, 2013

(65) Prior Publication Data

US 2014/0319530 A1    Oct. 30, 2014

(30) Foreign Application Priority Data

Apr. 30, 2013   (KR) .................. 10-2013-0047867

(51) Int. Cl.
*H01L 21/00*  (2006.01)
*G02F 1/1362*  (2006.01)
*H01L 27/12*  (2006.01)

(52) U.S. Cl.
CPC ............ *G02F 1/1362* (2013.01); *H01L 27/124* (2013.01)

USPC ............................... 257/72; 349/139; 349/141

(58) Field of Classification Search
CPC ........................... G02F 1/1362; H01L 27/124
USPC .......... 349/141, 139, 149; 257/139, 141, 149, 257/72
See application file for complete search history.

(56) References Cited

U.S. PATENT DOCUMENTS 7,612,854 B2 * 11/2009 Kang ............................ 349/141

\* cited by examiner

*Primary Examiner* — Laura Menz
(74) *Attorney, Agent, or Firm* — Brinks Gilson & Lione

(57) ABSTRACT

An array substrate for a liquid crystal display device, comprises: a substrate having a display region and a non-display region; a gate line and first and second data lines on the substrate; first and second thin film transistors in the first and second pixel regions, respectively, the first thin film transistor connected to the gate line and the first data line, the second thin film transistor connected to the gate line and the second data line; a planarization layer on the first and second thin film transistors, the planarization layer having a drain contact hole exposing both of drain electrodes of the first and second thin film transistors; and a pixel electrode and a common electrode over the planarization layer.

11 Claims, 5 Drawing Sheets

ARRAY SUBSTRATE FOR LIQUID CRYSTAL DISPLAY DEVICE

CROSS REFERENCE TO RELATED APPLICATIONS

The present application claims the benefit of priority of Korean Patent Application No. 10-2013-0047867 filed in the Republic of Korea on Apr. 30, 2013, which is hereby incorporated by reference in its entirety.

FIELD OF THE DISCLOSURE

The present disclosure relates to a liquid crystal display device. The present disclosure also relates to an array substrate for a fringe field switching mode liquid crystal display device where aperture ratio is improved.

DISCUSSION OF THE RELATED ART

A liquid crystal display (LCD) device, which is advantageous to displaying moving images and popularly used for a display of a portable device, a monitor of a computer and a television due to a high contrast ratio, forms images based on optical anisotropy and polarization of liquid crystal molecules. Since the liquid crystal molecule has a thin and long profile, arrangement of the liquid crystal molecule has a direction. When the liquid crystal molecule is disposed in an electric field, the arrangement direction of the liquid crystal molecule is changed according to an intensity and a direction of the electric field.

The LCD device includes a liquid crystal panel as an essential component. The LC panel may include two substrates having two electrodes thereon and a liquid crystal layer between the two substrates. The arrangement direction of the liquid crystal molecule in the liquid crystal layer may be adjusted by changing the electric field generated between the two electrodes, and transmittance of the liquid crystal layer may be changed to display various images.

In general, the LCD device includes an array substrate, a color filter substrate and a liquid crystal layer between the array substrate and the color filter substrate. A gate line and a data line, a switching element and a pixel electrode are formed on the array substrate, and a color filter layer and a common electrode are formed on the color filter substrate. The liquid crystal molecules in the liquid crystal layer are driven by a vertical electric field generated between the pixel electrode and the common electrode.

However, the LCD device using the vertical electric field perpendicular to the array substrate has a relatively narrow viewing angle. For the purpose of improving the viewing angle, an in-plane switching (IPS) mode LCD device has been suggested. In the IPS mode LCD device, a pixel electrode and a common electrode are alternately formed on the array substrate and a horizontal electric field is generated between the pixel electrode and the common electrode. Since the liquid crystal molecule is driven by the horizontal electric field to move along a direction parallel to the array substrate, a viewing angle of the IPS mode LCD device is improved.

However, the IPS mode LCD device has a relatively low aperture ratio and a relatively low transmittance. For the purpose of improving the aperture ratio and the transmittance, a fringe field switching (FFS) mode LCD device where the liquid crystal molecule is driven by a fringe field has been suggested.

FIG. 1 is a plan view showing an array substrate for a fringe field switching mode liquid crystal display device according to the related art.

In FIG. 1, a gate line 43 and a data line 51 are formed on an array substrate 1 for a fringe field switching (FFS) mode liquid crystal display (LCD) device. The gate line 43 cross the data line to define a pixel region P. A thin film transistor (TFT) Tr connected to the gate line 43 and the data line 51 is formed in the pixel region P. The TFT Tr includes a semiconductor layer 41 of polycrystalline silicon, a gate insulating layer (not shown) on the semiconductor layer 41, first and second gate electrodes 44a and 44b on the gate insulating layer and source and drain electrodes 55 and 58 contacting the semiconductor layer 41. The first and second gate electrodes 44a and 44b are spaced apart from each other, and the source and drain electrodes 55 and 58 are spaced apart from each other.

Although a TFT including a semiconductor layer of polycrystalline silicon has a higher mobility as compared with a TFT including a semiconductor layer of amorphous silicon, a TFT including a semiconductor layer of polycrystalline silicon has a higher off current due to a leakage current as compared with a TFT including a semiconductor layer of amorphous silicon. For the purpose of reducing the off current, the TFT Tr including the semiconductor layer 41 of polycrystalline silicon is formed to have a dual gate of the first and second gate electrodes 44a and 44b.

A planarization layer (not shown) of a photo acrylic material is formed on the TFT Tr, and a common electrode 60 is formed on the planarization layer. The common electrode 60 has a first opening (not shown) corresponding to the TFT Tr in the pixel region P.

A passivation layer (not shown) is formed on the common electrode 60, and a pixel electrode 70 connected to the TFT Tr is formed on the passivation layer in the pixel region P. The pixel electrode 70 contacts the drain electrode 58 of the TFT Tr through a drain contact hole dch and has a plurality of second openings op2 having a bar shape parallel to the data line 51.

The FFS mode LCD device 1 may be used as a large-sized display such as a television or a small-sized display for a personal portable appliance such as a smart phone and a tablet personal computer. The large-sized display or the small-sized display requires an excellent display quality due to a high resolution. The resolution in a display device may be defined as the number of pixels in unit area (pixel per inch: PPI) and a device of a high resolution may has a resolution equal to or greater than about 200 PPI.

For the purpose of obtaining a high resolution, the number of pixels in a unit area should be increased and an area of the pixel region should be decreased. However, since the area of the pixel region relates to elements of the display device, disposition of the elements and an aperture ratio of the display device, there is a limitation on decreasing the area of the pixel region. Specifically, since the aperture ratio is a crucial factor for a high resolution in the LCD device among various display devices, a high aperture ratio is required to the LCD device of a high resolution.

The array substrate 1 for the FFS mode LCD device includes the planarization layer of photo acrylic material and the planarization layer has the drain contact hole dch exposing the drain electrode 58 of the TFT Tr. The drain contact hole dch has a minimum area for preventing deterioration and is formed in each pixel region P. As a result, the drain contact hole dch is a factor reducing the aperture ratio. The array substrate 1 for the FFS mode LCD device is required to have a structure of a high aperture ratio for a high resolution.

SUMMARY

An array substrate for a liquid crystal display device, comprises: a substrate having a display region and a non-display region surrounding the display region; a gate line and first and second data lines on the substrate, the gate line parallel to a horizontal direction, the first and second data lines spaced apart from each other and parallel to a vertical direction, the gate line crossing the first and second data lines to define first and second pixel regions disposed along the vertical direction in the display region; first and second thin film transistors in the first and second pixel regions, respectively, the first thin film transistor connected to the gate line and the first data line, the second thin film transistor connected to the gate line and the second data line; a planarization layer on the first and second thin film transistors, the planarization layer having a drain contact hole exposing both of drain electrodes of the first and second thin film transistors; and a pixel electrode and a common electrode over the planarization layer, the pixel electrode and the common electrode overlapping each other in the first and second pixel regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EXEMPLARY EMBODIMENTS

Reference will now be made in detail to the preferred embodiments, examples of which are illustrated in the accompanying drawings.

Figure 2:
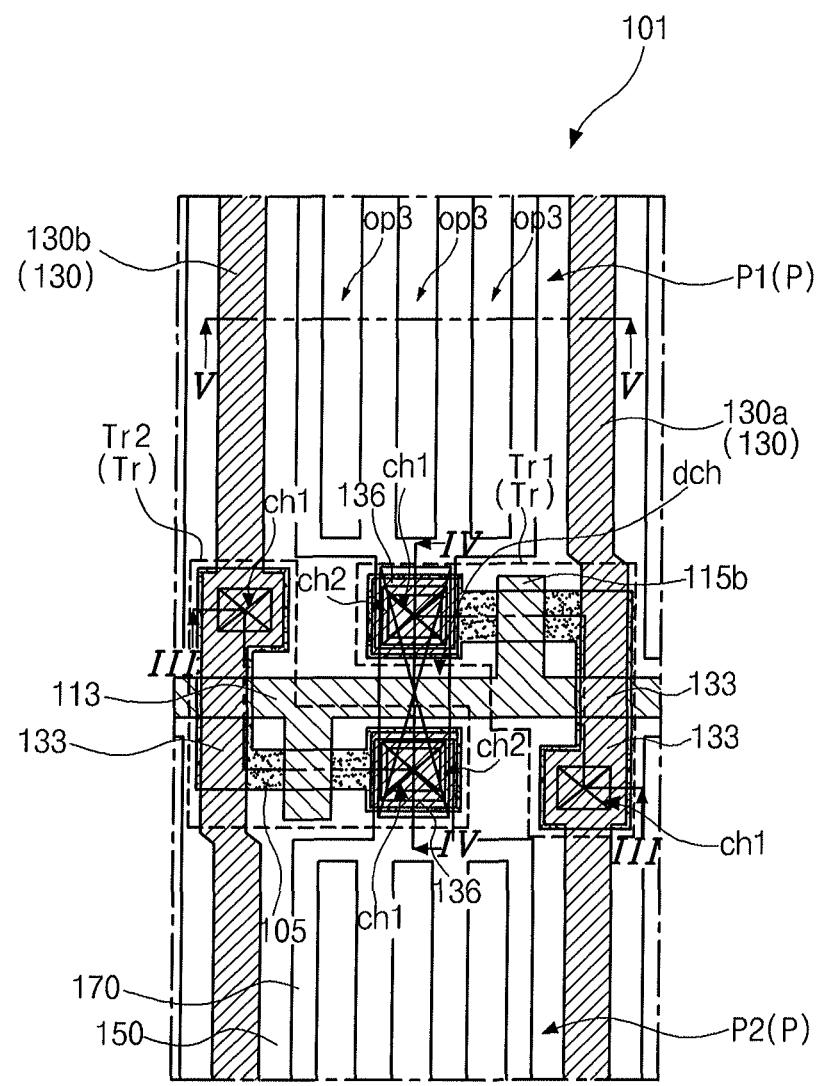
FIG. 2 is a plan view showing an array substrate for a fringe field switching mode liquid crystal display device according to a first embodiment of the present invention.

FIG. 2 is a plan view showing an array substrate for a fringe field switching mode liquid crystal display device according to a first embodiment of the present invention.

In FIG. 2, a gate line 113 and a data line 130 are formed in a display region on a substrate 101 for a fringe field switching (FFS) mode liquid crystal display (LCD) device. Each of the gate line 113 and the data line 130 includes a metallic material. For example, at least one of aluminum (Al), aluminum alloy such as aluminum neodymium (AlNd), copper (Cu), copper alloy, molybdenum (Mo) and molybdenum alloy such as molybdenum titanium (MoTi) may be used for each of the gate line 113 and the data line 130. The gate line 113 and the data line 130 cross each other to define a region P. For example, the data line 130 may include first and second data lines 130a and 130b spaced apart from each other and parallel to a vertical direction, and the pixel region P may include first and second pixel regions P1 and P2 disposed along the vertical direction. The gate line 113 may cross the first and second data lines 130a and 130b to define the first and second pixel regions P1 and P2.

A thin film transistor (TFT) Tr connected to the gate line 113 and the data line 130 is formed to correspond to each pixel region P. For example, first and second TFTs Tr1 and Tr2 may be formed to correspond to the first and second pixel regions P1 and P2, respectively. The TFT Tr includes a semiconductor layer 105 of polycrystalline silicon, first and second gate electrodes 115a and 115b and source and drain electrodes 133 and 136. Since the TFT Tr includes the semiconductor layer 105 of polycrystalline silicon, the TFT Tr has an excellent mobility as compared with the TFT including a semiconductor layer of amorphous silicon. In addition, since the TFT Tr has a dual gate structure including the first and second gate electrodes 115a and 115b spaced apart from each other, the TFT Tr has an excellent off current as compared with the TFT having a single gate structure.

The first gate electrode 115a may be a portion of the gate line 113, and the second electrode 115b may be a portion protruding from the gate line 113. In addition, the semiconductor layer 105 may be disposed in the vertically adjacent first and second pixel regions P1 and P2 to cross the first gate electrode 115a of the gate line 113. Further, the source electrode 133 may be disposed in the vertically adjacent first and second pixel regions P1 and P2 to cross the first gate electrode 115a of the gate line 113. For example, the source electrode 133 may be a portion of the data line 130 crossing the gate line 113 in the vertically adjacent first and second pixel regions P1 and P2. Since the semiconductor layer 105 and the source electrode 133 are disposed at a boundary of the pixel region P and do not reduce the aperture ratio, the aperture ratio of the substrate 101 according to the first embodiment of the present invention is improved as compared to the array substrate 1 of the related art.

The first and second TFTs Tr1 and Tr2 driving the first and second pixel regions P1 and P2, respectively, are disposed adjacent to the gate line 113 between the first and second pixel regions P1 and P2. In addition, the first and second TFTs Tr1 and Tr2 are not disposed in border regions between the first pixel region P1 and an upper pixel region previous to the first pixel region P1 and between the second pixel region P2 and a lower pixel region next to the second pixel region P2. Further, the first and second TFTs Tr1 and Tr2 are not disposed in a border region between a first right pixel region adjacent to the first pixel region P1 and a second right pixel region adjacent to the second pixel region P2. Accordingly, the first and second TFTs Tr1 and Tr2 are alternately disposed between the vertically adjacent first and second pixel regions P1 and P2 along a vertical direction and along a horizontal direction. For example, the first and second TFTs Tr1 and Tr2 as a whole may be disposed to have a zigzag shape along each of the vertical and horizontal directions through the substrate 101.

A planarization layer 140 (of FIG. 3) is formed on the TFT Tr. Since a step difference due to the gate line 113, the data line 130 and the TFT Tr is minimized by the planarization layer 140, a uniform gap distance between a common electrode 150 and a pixel electrode 170 is obtained. The planarization layer 140 has a drain contact hole dch exposing both of the drain electrodes 136 of the first and second TFTs Tr1 and Tr2 together. Accordingly, both of the drain electrodes 136 of the first and second TFTs Tr1 and Tr2 are exposed through the single drain contact hole dch.

The planarization layer 140 may include an organic insulating material such as photo acrylic material to have a greater thickness as compared to an inorganic insulating material layer. For example, the planarization layer 140 of an organic insulating material may have a thickness of about 1 μm to about 2 μm, while an inorganic insulating material layer may have a thickness of about 0.2 μm to about 0.6 μm. Since of the planarization layer 140 of an organic insulating material has a greater thickness than an inorganic insulating material layer, a greater area is required for forming the drain contact hole dch in the planarization layer 140 of an organic insulating material.

Figure 1:
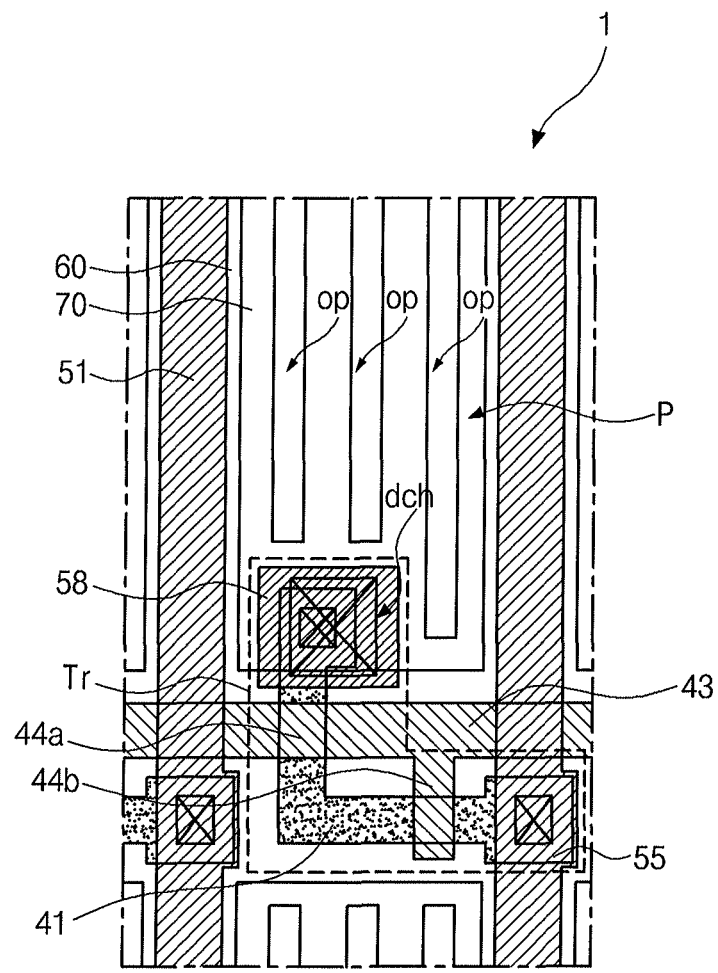
FIG. 1 is a plan view showing an array substrate for a fringe field switching mode liquid crystal display device according to the related art.

A portion corresponding to the drain contact hole dch does not contribute to displaying an image and is blocked by a black matrix of a color filter substrate facing the array substrate. As a result, an aperture ratio is reduced by the drain contact hole dch. In the array substrate, since the single drain contact hole dch is formed to correspond to the adjacent two pixel regions P1 and P2, an aperture ratio is improved as compared with the array substrate 1 (of FIG. 1) of the related art where the drain contact hole dch (of FIG. 1) is formed to correspond to each pixel region P (of FIG. 1).

The common electrode 150 is formed on the planarization layer 140. Each of the common electrode 150 and the planarization layer 140 may be formed on an entire surface of the substrate 101. The common electrode 150 may include a transparent conductive material such as indium-tin-oxide (ITO) and indium-zinc-oxide (IZO).

The common electrode 150 has a first opening op1 (of FIG. 3) corresponding to the first and second TFTs Tr1 and Tr2. The first opening op1 exposes the first and second TFTs Tr1 and Tr2 to prevent an electrical shortage between the common electrode 150 and one of the drain electrode 136 and the pixel electrode 170 and to reduce a parasitic capacitance between the common electrode 150 and one of the first and second gate electrodes 115a and 115b and source and drain electrodes 133 and 136.

In addition, the common electrode 150 may have a second opening corresponding to the data line 130. The second opening may correspond to a portion of the data line 130 or the whole data line 130. When the second opening corresponds to the whole data line 130, the common electrode 150 may have separated parts with respect to the data line 130 in a display region and the separated parts of the common electrode 150 may be electrically connected to each other in a non-display region surrounding the display region.

A passivation layer 160 (of FIG. 3) is formed on the common electrode 150 and the pixel electrode 170 is formed on the passivation layer 160 in each pixel region P. The passivation layer 160 may be formed on an entire surface of the substrate 101. The pixel electrode 170 may have a plate shape and may include a transparent conductive material such as indium-tin-oxide (ITO) and indium-zinc-oxide (IZO). The passivation layer 160 has a drain exposing hole ch2 exposing the drain electrode 136 of the TFT Tr.

The pixel electrode 170 has a plurality of third openings op3 spaced apart from each other and is connected to the drain electrode 136 of the TFT Tr through the drain exposing hole ch2 and the drain contact hole dch. Each of the plurality of third openings op3 may have a bar shape.

In the array substrate, although the single drain contact hole dch has a greater area than the drain contact hole dch (of FIG. 1) in each pixel region P (of FIG. 1) of the related art, the single drain contact hole dch has a smaller area than a sum of two drain contact holes dch (of FIG. 1) in two pixel regions P (of FIG. 1) of the related art. Accordingly, an aperture ratio of the array substrate for the FFS mode LCD device is improved as compared with the array substrate 1 (of FIG. 1) for the FFS mode LCD device of the related art.

In addition, the semiconductor layer 105 and the source electrode 133 are disposed at the boundary of the pixel region P to overlap the data line 130. Accordingly, an aperture ratio of the array substrate for the FFS mode LCD device is further improved as compared with the array substrate 1 (of FIG. 1) for the FFS mode LCD device of the related art where the semiconductor layer 41 (of FIG. 1) and the drain electrode 58 (of FIG. 1) are disposed in the pixel region P (of FIG. 1).

Figure 3:
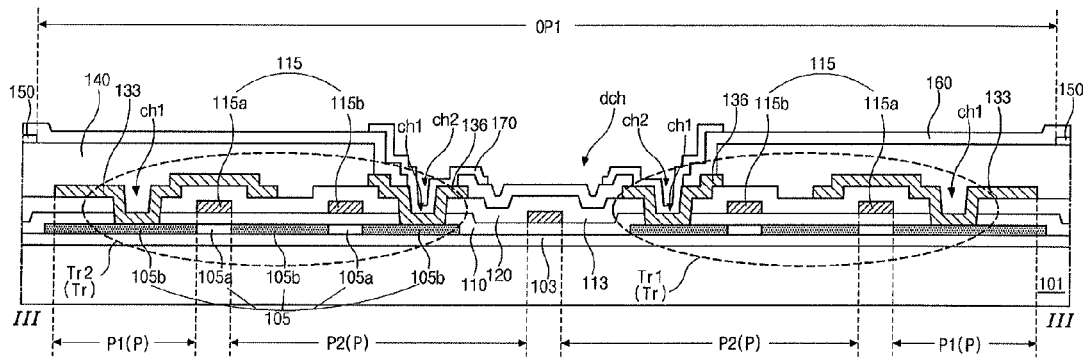
FIG. 3 is a cross-sectional view taken along a line of FIG. 2.
Figure 4:
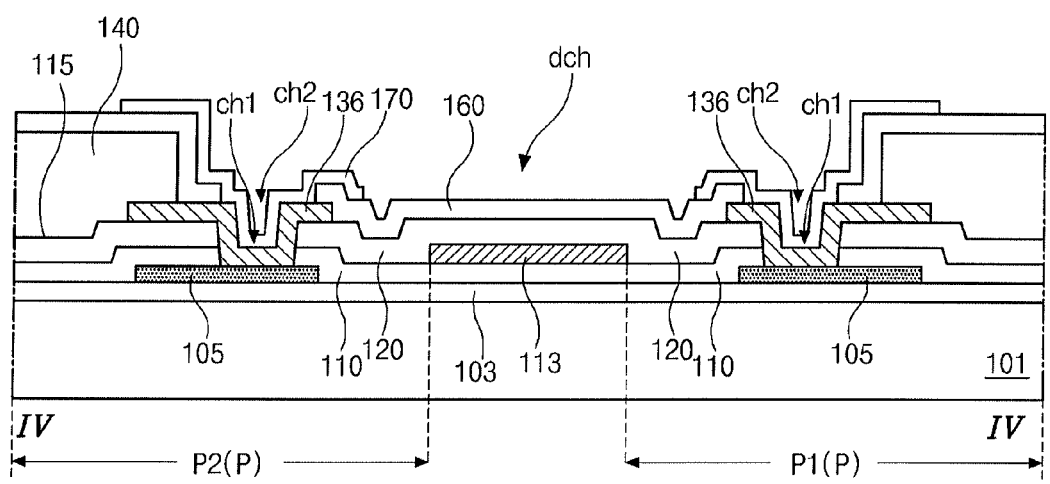
FIG. 4 is a cross-sectional view taken along a line IV-IV of FIG. 2.
Figure 5:
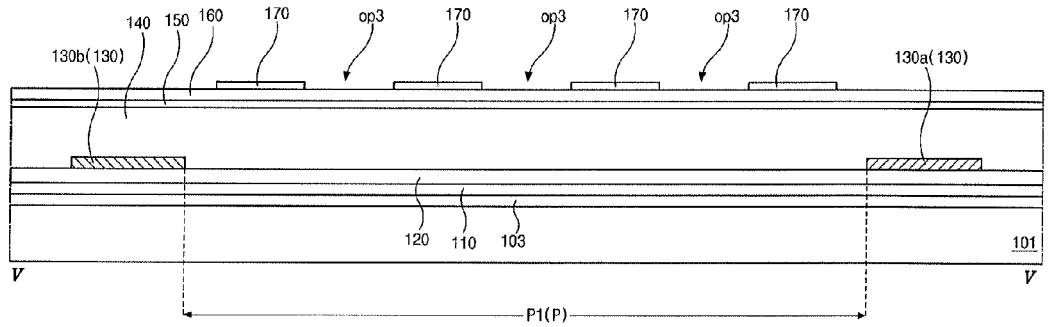
FIG. 5 is a cross-sectional view taken along a line V-V of FIG. 2.

FIG. 3 is a cross-sectional view taken along a line of FIG. 2, FIG. 4 is a cross-sectional view taken along a line IV-IV of FIG. 2, and FIG. 5 is a cross-sectional view taken along a line V-V of FIG. 2.

In FIGS. 3 to 5, a buffer layer 103 is formed on a substrate 101. The buffer layer 103 may include an inorganic insulating material such as silicon oxide ($SiO_2$) or silicon nitride (SiNx), and the substrate 101 may include a transparent insulating material such as glass or plastic. When amorphous silicon is crystallized to polycrystalline silicon, an alkali ion such as potassium ion (K+) or sodium ion (Na+) may be erupted from the substrate by a laser or a heat. The buffer layer 103 blocks the alkali ion to prevent deterioration of a semiconductor layer of polycrystalline silicon due to the alkali ion. The buffer layer 103 may be omitted in another embodiment.

A semiconductor layer 105 of polycrystalline silicon is formed on the buffer layer 103. The semiconductor layer 105 includes active regions 105a of intrinsic polycrystalline silicon and ohmic contact regions 105b of impurity-doped polycrystalline silicon. The active regions 105a may be spaced apart from each other to correspond to first and second gate electrodes 115a and 115b. The ohmic contact regions 105b may be disposed at both sides of the active regions 105a and between the active regions 105a and may be doped with negative (N) type or positive (P) type impurities.

A gate insulating layer 110 is formed on the semiconductor layer 105, and a gate line 113 is formed on the gate insulating layer 110. The gate insulating layer 110 may include an inorganic insulating material such as silicon oxide ($SiO_2$) or silicon nitride (SiNx). The gate line 113 may have a single-layered structure or a multiple-layered structure of a metallic material. For example, at least one of aluminum (Al), aluminum alloy such as aluminum neodymium (AlNd), copper (Cu), copper alloy, molybdenum (Mo) and molybdenum alloy such as molybdenum titanium (MoTi) may be used for the gate line 113. A portion of the gate line 113 crossing a data line 130 constitutes a first gate electrode 115a and a second gate electrode 115b protrudes from the gate line 113.

An interlayer insulating layer 120 is formed on the gate line 113, the first gate electrode 115a and the second gate electrode 115b. The interlayer insulating layer 120 may include an inorganic insulating material such as silicon oxide ($SiO_2$) or silicon nitride (SiNx). The interlayer insulating layer 120 has semiconductor contact holes ch1 exposing the ohmic contact regions 105b at both sides of the active regions 105a of the semiconductor layer 105. Accordingly, the semiconductor layer 105 corresponds to two semiconductor contact holes ch1.

A data line 130, a source electrode 133 and a drain electrode 136 are formed on the interlayer insulating layer 120. The data line 130 including first and second data lines 130a and 130b crosses the gate line 113 to define a pixel region P including first and second pixel regions P1 and P2. The data line 130 may have a single-layered structure or a multiple-layered structure of a metallic material. For example, at least one of aluminum (Al), aluminum alloy such as aluminum neodymium (AlNd), copper (Cu), copper alloy, molybdenum (Mo) and molybdenum alloy such as molybdenum titanium (MoTi) may be used for the data line 130.

In addition, the source and drain electrodes 133 and 136 are spaced apart from each other and are connected to the ohmic contact regions 105b of the semiconductor layer 105 through the semiconductor contact hole ch1. The source electrode 133 may be a portion of the data line 130 and a portion of the semiconductor layer 105 is disposed under the source electrode 133 to overlap the source electrode 133. Since the semiconductor layer 105 and the source electrode 133 are disposed at a boundary of the pixel region P, the aperture ratio is improved.

The semiconductor layer 105, the gate insulating layer 110, the first and second gate electrodes 115a and 115b, the interlayer insulating layer 120, the source electrode 133 and the drain electrode 136 constitute a thin film transistor (TFT) Tr. For example, first and second TFTs Tr1 and Tr2 driving the first and second pixel regions P1 and P2, respectively, may be disposed adjacent to the gate line 113 between the first and second pixel regions P1 and P2.

Specifically, the drain electrode 136 of the first TFT Tr1 and the drain electrode 136 of the second TFT Tr2 may be disposed in the first and second pixel regions P1 and P2, respectively, adjacent to the gate line 113. Since the two drain electrodes 136 of the first and second TFTs Tr1 and Tr2 are disposed adjacent to each other, a single drain contact hole dch of a planarization layer 140 may expose both of the two adjacent drain electrodes 136 of the first and second TFTs Tr1 and Tr2.

A planarization layer 140 is formed on the data line 130 and the TFT Tr. The planarization layer 140 may include an organic insulating material such as a photo acrylic material. The planarization layer 140 has a drain contact hole dch exposing both of the two adjacent drain electrodes 136 of the first and second TFTs Tr1 and Tr2 and a portion of the gate line 113 between the two adjacent drain electrodes 136 of the first and second TFTs Tr1 and Tr2. As a result, the single drain contact hole dch of the planarization layer 140 is formed to correspond to the two adjacent pixel regions P1 and P2 in the first embodiment, while the drain contact hole dch (of FIG. 1) of the planarization layer is formed to correspond to each pixel region P (of FIG. 1) in the related art. As a result, an area of the drain contact hole dch for the two adjacent drain electrodes 136 is reduced and an aperture ratio is improved.

Further, the single drain contact hole dch in the first and second pixel regions P1 and P2 of the first embodiment has a greater area as compared with the drain contact hole dch (of FIG. 1) in the pixel region P (of FIG. 1) of the related art. As a result, reliability of a fabrication step of forming the drain contact hole dch is improved such that the drain electrode 136 is stably exposed. Accordingly, reliability in electrical connection between the drain electrode 136 and the pixel electrode 170 through the drain contact hole dch is improved.

A common electrode 150 is formed on the planarization layer 140. The common electrode 150 may include a transparent conductive material such as indium-tin-oxide (ITO) and indium-zinc-oxide (IZO) and may be formed on an entire surface of the substrate 101. The common electrode 150 has a first opening op1 corresponding to the first and second TFTs Tr1 and Tr2. The first opening op1 may have a greater area than the drain contact hole dch. The first opening op1 completely overlaps the drain contact holes dch of the first and second TFTs Tr1 and Tr2 to prevent an electrical shortage between the common electrode 150 and one of the drain electrode 136 and the pixel electrode 170. In addition, the common electrode 150 may have a second opening corresponding to the data line 130.

A passivation layer 160 is formed on the common electrode 150. The passivation layer 160 may include an inorganic insulating material such as silicon oxide ($SiO_2$) or silicon nitride (SiNx) and may be formed on an entire surface of the substrate 101. The passivation layer 160 has a drain exposing hole ch2 corresponding to the drain contact hole dch and exposing the drain electrode 136. Accordingly, the two adjacent exposing holes ch2 of the passivation layer 160 for the first and second TFTs Tr1 and Tr2 are spaced apart from each other in the single drain contact hole dch of the planarization layer 140.

A pixel electrode 170 is formed on the passivation layer 160 in each pixel region P. The pixel electrode 170 may include a transparent conductive material such as indium-tin-oxide (ITO) and indium-zinc-oxide (IZO) and may be connected to the drain electrode 136 through the drain exposing hole ch2 and the drain contact hole dch. The pixel electrode 170 overlaps the common electrode 150. The two adjacent pixel electrodes 170 are spaced apart from each other in the drain contact hole dch. In addition, the pixel electrode 170 may have a plurality of third openings op3 spaced apart from each other. Each of the plurality of third openings op3 may have a bar shape. Although the array substrate of the first embodiment has a pixel top structure where the pixel electrode 170 is formed over the common electrode 150, an array substrate of another embodiment may have a common top structure where the common electrode is formed over the pixel electrode. In the array substrate of a common top structure, a drain exposing hole of a passivation layer in a drain contact hole of a planarization layer may be omitted.

Figure 6:
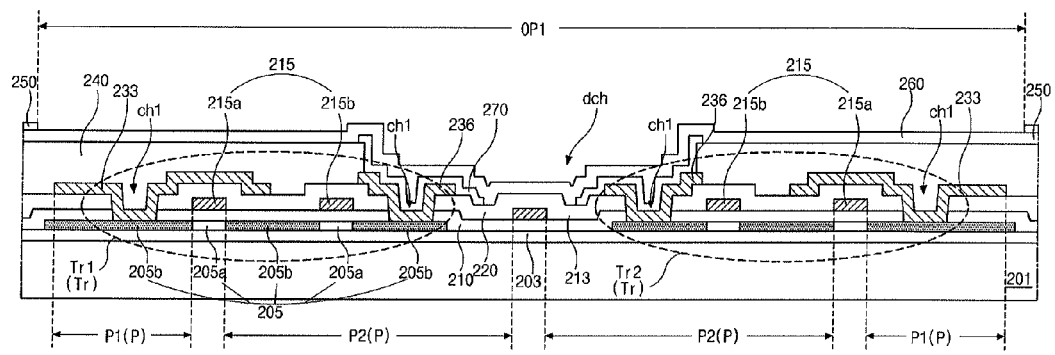
FIG. 6 is a cross-sectional view corresponding to a line of FIG. 2 and showing an array substrate for a fringe field switching mode liquid crystal display device according to a second embodiment of the present invention.
Figure 7:
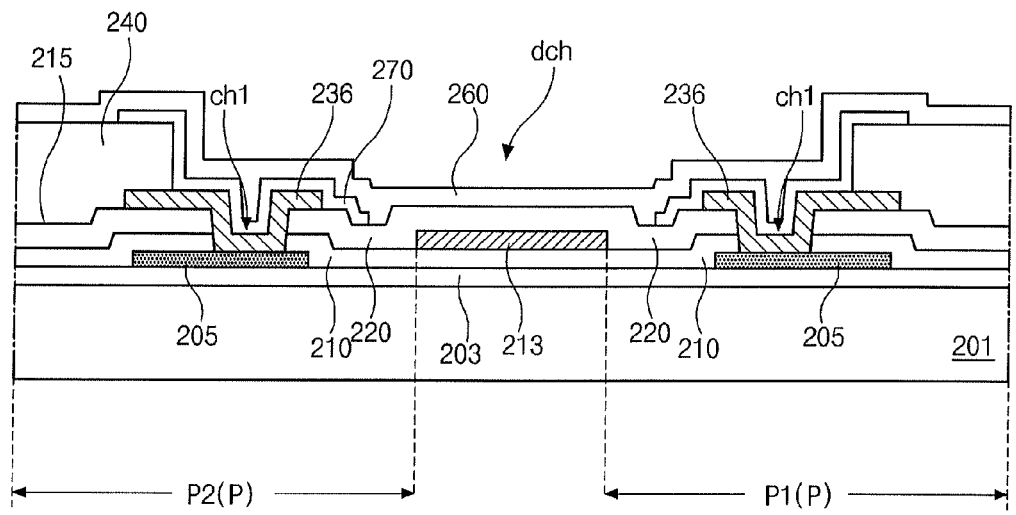
FIG. 7 is a cross-sectional view corresponding to a line IV-IV of FIG. 2 and showing an array substrate for a fringe field switching mode liquid crystal display device according to a second embodiment of the present invention.
Figure 8:
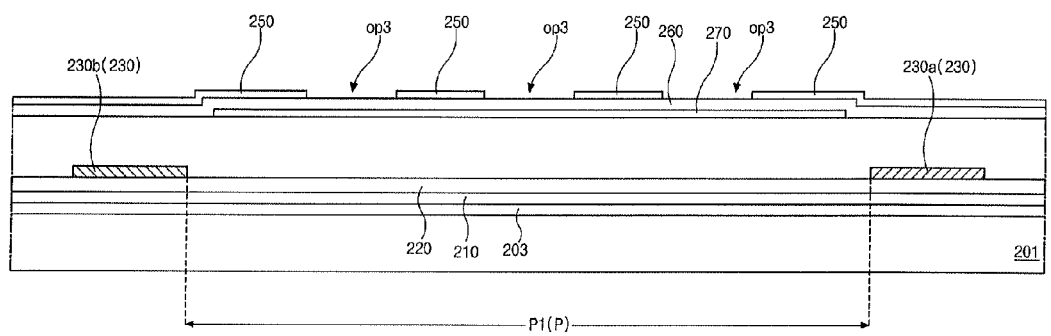
FIG. 8 is a cross-sectional view corresponding to a line V-V of FIG. 2 and showing an array substrate for a fringe field switching mode liquid crystal display device according to a second embodiment of the present invention.

FIGS. 6, 7 and 8 are cross-sectional views showing an array substrate for a fringe field switching mode liquid crystal display device according to a second embodiment of the present invention. FIGS. 6, 7 and 8 show cross-sections corresponding to lines IV-IV and V-V, respectively, of FIG. 2.

In FIGS. 6 to 8, a buffer layer 203 is formed on a substrate 201. The buffer layer 203 may include an inorganic insulating material such as silicon oxide ($SiO_2$) or silicon nitride (SiNx), and the substrate 201 may include a transparent insulating material such as glass or plastic. When amorphous silicon is crystallized to polycrystalline silicon, an alkali ion such as potassium ion (K+) or sodium ion (Na+) may be erupted from the substrate by a laser or a heat. The buffer layer 203 blocks the alkali ion to prevent deterioration of a semiconductor layer of polycrystalline silicon due to the alkali ion. The buffer layer 203 may be omitted in another embodiment.

A semiconductor layer 205 of polycrystalline silicon is formed on the buffer layer 203. The semiconductor layer 205 includes active regions 205a of intrinsic polycrystalline silicon and ohmic contact regions 205b of impurity-doped polycrystalline silicon. The active regions 205a may be spaced apart from each other to correspond to first and second gate electrodes 215a and 215b. The ohmic contact regions 205b may be disposed at both sides of the active regions 205a and between the active regions 205a and may be doped with negative (N) type or positive (P) type impurities.

A gate insulating layer 210 is formed on the semiconductor layer 205, and a gate line 213 is formed on the gate insulating layer 210. The gate insulating layer 210 may include an inorganic insulating material such as silicon oxide (SiO$_2$) or silicon nitride (SiNx). The gate line 213 may have a single-layered structure or a multiple-layered structure of a metallic material. For example, at least one of aluminum (Al), aluminum alloy such as aluminum neodymium (AlNd), copper (Cu), copper alloy, molybdenum (Mo) and molybdenum alloy such as molybdenum titanium (MoTi) may be used for the gate line 213. A portion of the gate line 213 crossing a data line 230 constitutes a first gate electrode 215a and a second gate electrode 215b protrudes from the gate line 213.

An interlayer insulating layer 220 is formed on the gate line 213, the first gate electrode 215a and the second gate electrode 215b. The interlayer insulating layer 220 may include an inorganic insulating material such as silicon oxide (SiO$_2$) or silicon nitride (SiNx). The interlayer insulating layer 220 has semiconductor contact holes ch1 exposing the ohmic contact regions 205b at both sides of the active regions 205a of the semiconductor layer 205. Accordingly, the semiconductor layer 205 corresponds to two semiconductor contact holes ch1.

A data line 230, a source electrode 233 and a drain electrode 236 are formed on the interlayer insulating layer 220. The data line 230 including first and second data lines 230a and 230b crosses the gate line 213 to define a pixel region P including first and second pixel regions P1 and P2. The data line 230 may have a single-layered structure or a multiple-layered structure of a metallic material. For example, at least one of aluminum (Al), aluminum alloy such as aluminum neodymium (AlNd), copper (Cu), copper alloy, molybdenum (Mo) and molybdenum alloy such as molybdenum titanium (MoTi) may be used for the data line 230.

In addition, the source and drain electrodes 233 and 236 are spaced apart from each other and are connected to the ohmic contact regions 205b of the semiconductor layer 205 through the semiconductor contact hole ch1. The source electrode 233 may be a portion of the data line 230 and a portion of the semiconductor layer 205 is disposed under the source electrode 233 to overlap the source electrode 233. Since the semiconductor layer 205 and the source electrode 233 are disposed at a boundary of the pixel region P, the aperture ratio is improved.

The semiconductor layer 205, the gate insulating layer 210, the first and second gate electrodes 215a and 215b, the interlayer insulating layer 220, the source electrode 233 and the drain electrode 236 constitute a thin film transistor (TFT) Tr. For example, first and second TFTs Tr1 and Tr2 driving the first and second pixel regions P1 and P2, respectively, may be disposed adjacent to the gate line 213 between the first and second pixel regions P1 and P2.

Specifically, the drain electrode 236 of the first TFT Tr1 and the drain electrode 236 of the second TFT Tr2 may be disposed in the first and second pixel regions P1 and P2, respectively, adjacent to the gate line 213. Since the two drain electrodes 236 of the first and second TFTs Tr1 and Tr2 are disposed adjacent to each other, a single drain contact hole dch of a planarization layer 240 may expose both of the two adjacent drain electrodes 236 of the first and second TFTs Tr1 and Tr2.

A planarization layer 240 is formed on the data line 230 and the TFT Tr. The planarization layer 240 may include an organic insulating material such as a photo acrylic material.

The planarization layer 240 has a drain contact hole dch exposing both of the two adjacent drain electrodes 236 of the first and second TFTs Tr1 and Tr2 and a portion of the gate line 213 between the two adjacent drain electrodes 236 of the first and second TFTs Tr1 and Tr2. As a result, the single drain contact hole dch of the planarization layer 240 is formed to correspond to the two adjacent pixel regions P1 and P2 in the second embodiment, while the drain contact hole dch (of FIG. 1) of the planarization layer is formed to correspond to each pixel region P (of FIG. 1) in the related art. As a result, an area of the drain contact hole dch for the two adjacent drain electrodes 236 is reduced and an aperture ratio is improved.

Further, the single drain contact hole dch in the first and second pixel regions P1 and P2 of the second embodiment has a greater area as compared with the drain contact hole dch (of FIG. 1) in the pixel region P (of FIG. 1) of the related art. As a result, reliability of a fabrication step of forming the drain contact hole dch is improved such that the drain electrode 236 is stably exposed. Accordingly, reliability in electrical connection between the drain electrode 236 and the pixel electrode 270 through the drain contact hole dch is improved.

A pixel electrode 270 is formed on the planarization layer 240. The pixel electrode 270 may include a transparent conductive material such as indium-tin-oxide (ITO) and indium-zinc-oxide (IZO) and may is connected to the drain electrode 236 through the drain contact hole dch. The two adjacent pixel electrodes 270 are spaced apart from each other in the drain contact hole dch.

A passivation layer 260 is formed on the pixel electrode 270. The passivation layer 260 may include an inorganic insulating material such as silicon oxide (SiO$_2$) or silicon nitride (SiNx) and may be formed on an entire surface of the substrate 201. The passivation layer 260 may completely cover the pixel electrode 270 without a drain exposing hole.

A common electrode 250 is formed on the passivation layer 260. The common electrode 250 may include a transparent conductive material such as indium-tin-oxide (ITO) and indium-zinc-oxide (IZO) and may be formed on an entire surface of the substrate 201. The common electrode 250 overlaps the pixel electrode 270. The common electrode 270 may have a first opening op1 exposing and corresponding to the first and second TFTs Tr1 and Tr2 to reduce a parasitic capacitance between the common electrode 250 and one of the first and second gate electrodes 215a and 215b and the source and drain electrodes 233 and 236.

In addition, the common electrode 270 may have a second opening corresponding to the data line 230. The second opening may correspond to a portion of the data line 230 or the whole data line 230. When the second opening corresponds to the whole data line 230, the common electrode 250 may have separated parts with respect to the data line 230 in a display region and the separated parts of the common electrode 250 may be electrically connected to each other in a non-display region surrounding the display region. Further, the common electrode 250 may have a plurality of third openings op3 spaced apart from each other. Each of the plurality of third openings op3 may have a bar shape.

In the array substrate of a common top structure, since the single drain contact hole dch of the planarization layer 240 is formed to correspond to the two adjacent pixel regions P1 and P2, an area of the drain contact hole dch for the two adjacent drain electrodes 236 is reduced. In addition, the semiconductor layer 205 and the source electrode 233 are disposed at a boundary of the pixel region P. As a result, the aperture ratio is improved.

Consequently, in an array substrate for a fringe field switching mode liquid crystal display device according to the present disclosure, since a single drain contact hole of a planarization layer is formed to correspond to two adjacent pixel regions, an area of a drain contact hole for two adjacent drain electrodes is reduced. In addition, a semiconductor layer and a source electrode are disposed at a boundary of a pixel region. As a result, an aperture ratio of the array substrate is improved and the fringe field switching mode liquid crystal display device has a high resolution. Further, since a semiconductor layer includes polycrystalline silicon, a mobility of a thin film transistor is improved. Since the thin film transistor has a dual gate structure, an off current due to a leakage current is reduced.

It will be apparent to those skilled in the art that various modifications and variations can be made in an array substrate for a liquid crystal display device of the present disclosure without departing from the spirit or scope of the invention. Thus, it is intended that the present invention covers the modifications and variations of this invention provided they come within the scope of the appended claims and their equivalents.

What is claimed is:

1. An array substrate for a liquid crystal display device, comprising:
    a substrate having a display region and a non-display region surrounding the display region;
    a gate line and first and second data lines on the substrate, the gate line parallel to a horizontal direction, the first and second data lines spaced apart from each other and parallel to a vertical direction, the gate line crossing the first and second data lines to define first and second pixel regions disposed along the vertical direction in the display region;
    first and second thin film transistors in the first and second pixel regions, respectively, the first thin film transistor connected to the gate line and the first data line, the second thin film transistor connected to the gate line and the second data line;
    a planarization layer on the first and second thin film transistors, the planarization layer having a single drain contact hole exposing both of first and second drain electrodes of the first and second thin film transistors; and
    a pixel electrode and a common electrode over the planarization layer, the pixel electrode and the common electrode overlapping each other in the first and second pixel regions.

2. The array substrate according to claim 1, wherein first and second thin film transistors are disposed adjacent to the gate line.

3. The array substrate according to claim 1, wherein the pixel electrode is disposed in each of the first and second pixel regions and is connected to the first and second drain electrodes of the first and second thin film transistors through the single drain contact hole.

4. The array substrate according to claim 1, wherein the common electrode is disposed in a whole of the display region and has a first opening exposing the first and second thin film transistors.

5. The array substrate according to claim 4, wherein a passivation layer is on the common electrode and the pixel electrode is on the passivation layer, and wherein the pixel electrode has a plurality of second openings each having a bar shape.

6. The display device according to claim 5, wherein the passivation layer has a drain exposing hole exposing the first and second drain electrodes of the first and second thin film transistors in the single drain contact hole.

7. The array substrate according to claim 4, wherein a passivation layer is on the pixel electrode and the common electrode is on the passivation layer, and wherein the common electrode has a plurality of second openings each having a bar shape.

8. The array substrate according to claim 1, wherein the first thin film transistor comprises:
    a first semiconductor layer of polycrystalline silicon;
    a gate insulating layer on the first semiconductor layer;
    a first gate electrode on the gate insulating layer over the first semiconductor layer;
    an interlayer insulating layer on the first gate electrode, the interlayer insulating layer having a first semiconductor contact hole exposing the first semiconductor layer;
    a first source electrode and the first drain electrode spaced apart from each other, the first source electrode and the first drain electrode connected to the first semiconductor layer through the first semiconductor contact hole, and
    wherein the second thin film transistor comprises:
    a second semiconductor layer of polycrystalline silicon;
    the gate insulating layer on the second semiconductor layer;
    a second gate electrode on the gate insulating layer over the second semiconductor layer;
    the interlayer insulating layer on the second gate electrode, the interlayer insulating layer having a second semiconductor contact hole exposing the second semiconductor layer;
    a second source electrode and the second drain electrode spaced apart from each other, the second source electrode and the second drain electrode connected to the second semiconductor layer through the second semiconductor contact hole.

9. The array substrate according to claim 8, wherein the gate electrode includes first and second gate electrodes crossing the semiconductor layer and spaced apart from each other.

10. The array substrate according to claim 9, wherein the first gate electrode includes a portion of the gate line and the second gate electrode protrudes from the gate line.

11. The array substrate according to claim 10, wherein the source electrode includes a portion of each of the first and second data lines and a portion of the semiconductor layer is disposed under the source electrode to overlap the source electrode.

* * * * *